(12) United States Patent
Lin et al.

(10) Patent No.: US 8,704,300 B1
(45) Date of Patent: Apr. 22, 2014

(54) SEMICONDUCTOR DEVICE AND FABRICATING METHOD THEREOF

(71) Applicant: Vanguard International Semiconductor Corporation, Hsinchu (TW)

(72) Inventors: Wen-Cheng Lin, Taipei (TW); Shang-Hui Tu, Jhubei (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 15 days.

(21) Appl. No.: 13/670,818

(22) Filed: Nov. 7, 2012

(51) Int. Cl.
*H01L 29/66* (2006.01)

(52) U.S. Cl.
USPC ............ 257/335; 257/339; 257/341; 257/371

(58) Field of Classification Search
USPC .................. 257/335, 339, 341, 371
See application file for complete search history.

(56) References Cited

U.S. PATENT DOCUMENTS

| 6,252,279 B1 * | 6/2001 | Kim ............................ 257/335 |
| 2002/0130361 A1 * | 9/2002 | Imam et al. ................... 257/341 |

* cited by examiner

*Primary Examiner* — Tan N Tran
(74) *Attorney, Agent, or Firm* — Birch, Stewart, Kolasch & Birch, LLP

(57) ABSTRACT

A semiconductor device including a semiconductor substrate of a first conductivity type and an epitaxial structure of the first conductivity type disposed thereon is disclosed. A well region of a second conductivity type is formed in the epitaxial structure and the semiconductor substrate. A drain region and a source region are respectively formed in the epitaxial structure inside and outside of the well region. At least one set of the first and second heavily doped regions is formed in the well region between the drain region and the source region, wherein the first and second heavily doped regions of the first and second conductivity type, respectively, are stacked vertically from bottom to top and have a doping concentration which is larger than that of the well region. A gate structure is disposed on the epitaxial structure. A method for fabricating a semiconductor device is also disclosed.

18 Claims, 5 Drawing Sheets

SEMICONDUCTOR DEVICE AND FABRICATING METHOD THEREOF

BACKGROUND OF THE INVENTION

1. Field of the Invention

The present invention relates to a semiconductor device, and in particular, to a semiconductor device having a super junction structure and a method for manufacturing the same.

2. Description of the Related Art

Semiconductor devices, such as high voltage elements, are typically divided into: vertical double-diffused metal-oxide-semiconductor field effect transistors (VDMOSFETs) and laterally diffused metal-oxide-semiconductor field effect transistors (LDMOSFETs). In order to increase the withstand voltage of the described high voltage elements, the doping concentration of the deep well region (or referred to as the drift region) is reduced, the depth of the drift region is increased, or the length of the isolation structure (or referred to as the field oxide layer) underlying the gate is increased.

FIG. 1 is a cross section of a conventional n-type LDMOSFET. The n-type LDMOSFET 10 comprises a p-type semiconductor substrate 100 and a p-type epitaxial layer 102 thereon. A gate structure 116 and a field oxide layer 114 are on the p-type epitaxial layer 102. Moreover, a p-type body region 106 and an n-type drift region 104 are respectively in the p-type epitaxial layer 102 on both sides of the gate structure 116, wherein the n-type drift region 104 further extends into the underlying p-type semiconductor substrate 100. A p-type contact region 108 and an adjacent n-type contact region 110 (or both referred to as a source region) are in the body region 106 and an n-type contact region 112 (or referred to as a drain region) is in the drift region 104. Moreover, a source electrode 117 is electrically connected to the p-type contact region 108 and the n-type contact region 110. A drain electrode 119 is electrically connected to the n-type contact region 112. A gate electrode 121 is electrically connected to the gate structure 116.

As mentioned above, in order to improve the withstand voltage of the transistor 10, the doping concentration of the drift region 104 has to be reduced and/or the length of the field oxide layer 114 underlying the gate structure 116 has to be increased. However, when the withstand voltage is increased by the described ways, the on-resistance (Ron) or the size of the transistor 10 is also increased.

Thus, there exists a need in the art for development of a semiconductor device, capable of increasing the withstand voltage while preventing the on-resistance from increasing.

BRIEF SUMMARY OF INVENTION

A detailed description is given in the following embodiments with reference to the accompanying drawings. Semiconductor devices and methods for fabricating the same are provided.

An exemplary embodiment of a semiconductor device includes a semiconductor substrate of a first conductivity type and an epitaxial structure of the first conductivity type disposed thereon. A well region of a second conductivity type is formed in the epitaxial structure and the semiconductor substrate. A drain region and a source region are respectively formed in the epitaxial structure inside and outside of the well region. At least one set of the first and second heavily doped regions is formed in the well region between the drain region and the source region, wherein the first and second heavily doped regions of the first and second conductivity types, respectively, are stacked vertically from bottom to top and have a doping concentration which is larger than that of the well region. A gate structure is disposed on the epitaxial structure.

An exemplary embodiment of a method for fabricating a semiconductor device comprises providing a semiconductor substrate of a first conductivity type. An epitaxial structure of the first conductivity type is formed on the semiconductor substrate. A well region of a second conductivity type is formed in the epitaxial structure and the semiconductor substrate. At least one set of the first and second heavily doped regions is formed in the well region, wherein the first and second heavily doped regions of the first and second conductivity types, respectively, are stacked vertically from bottom to top and have a doping concentration which is larger than that of the well region. A drain region and a source region are respectively formed in the epitaxial structure inside and outside of the well region, such that the set of the first and second heavily doped regions is in the well region between the drain region and the source region. A gate structure is formed on the epitaxial structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of a mode for carrying out the invention. This description is made for the purpose of illustrating the general principles of the invention and should not be taken in a limiting sense. The scope of the invention is best determined by reference to the appended claims.

Figure 1:
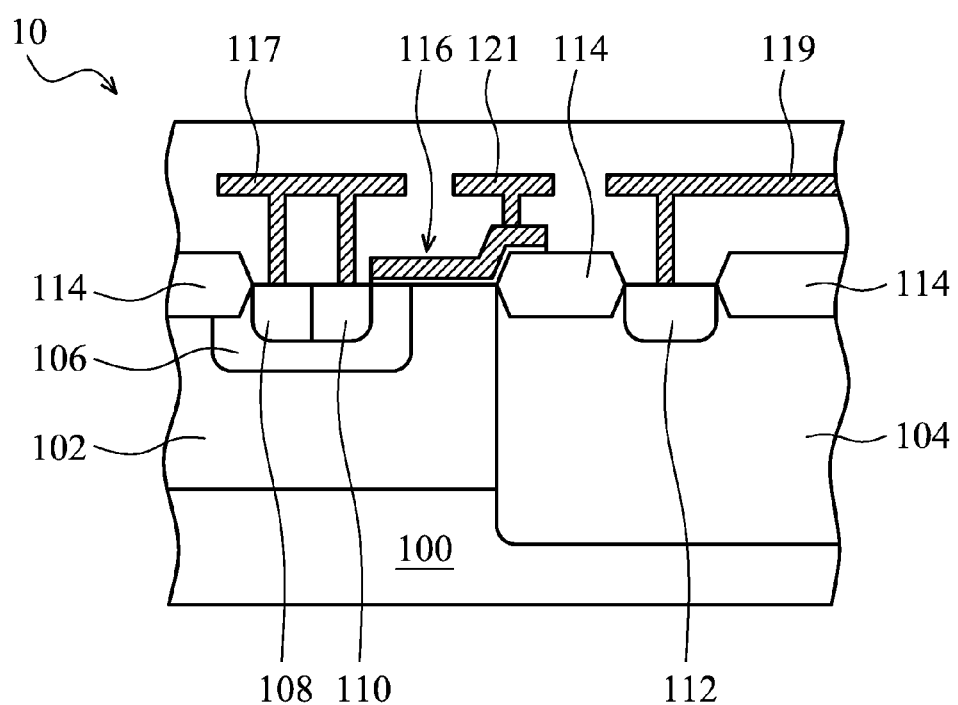
FIG. 1 is a cross section of a conventional n-type LDMOSFET.
Figure 2A:
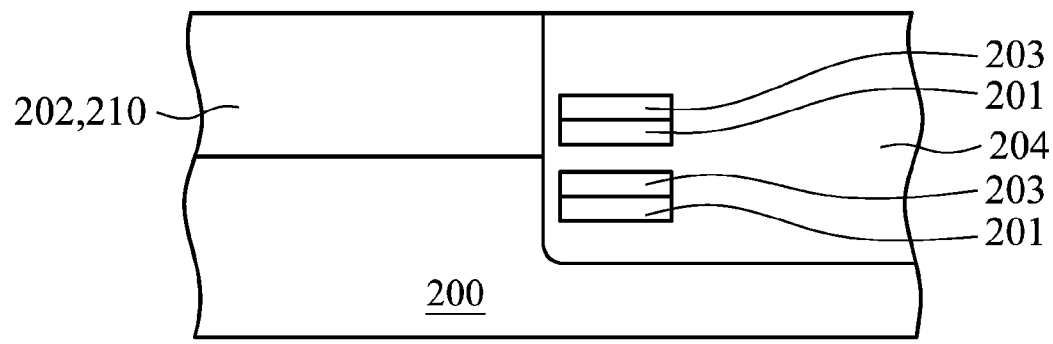
FIGS. 2A to 2D are cross sections of an exemplary embodiment of a method for fabricating a semiconductor device according to the invention.
Figure 2B:
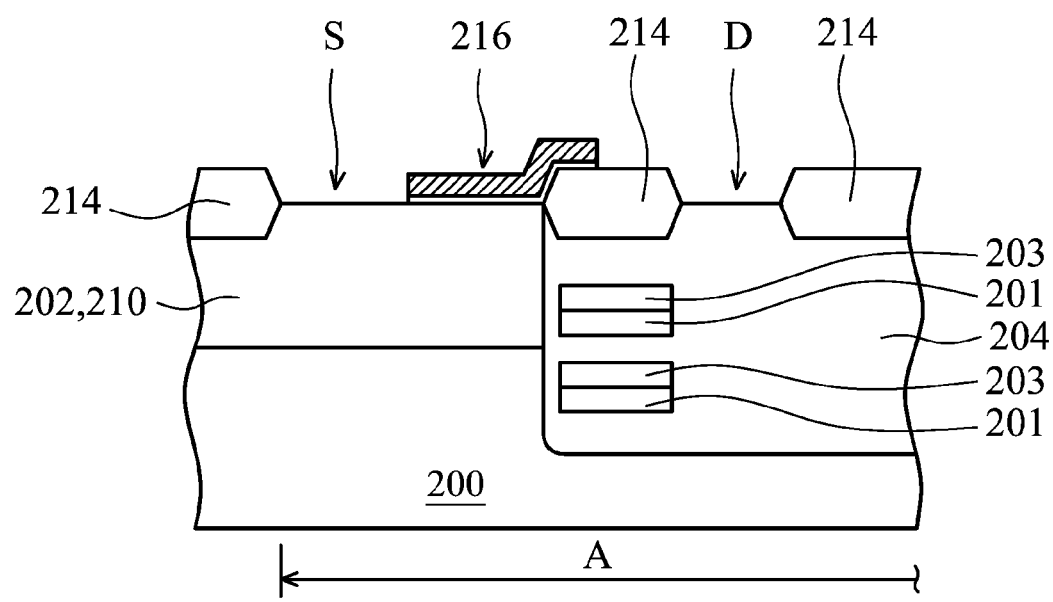
Figure 2C:
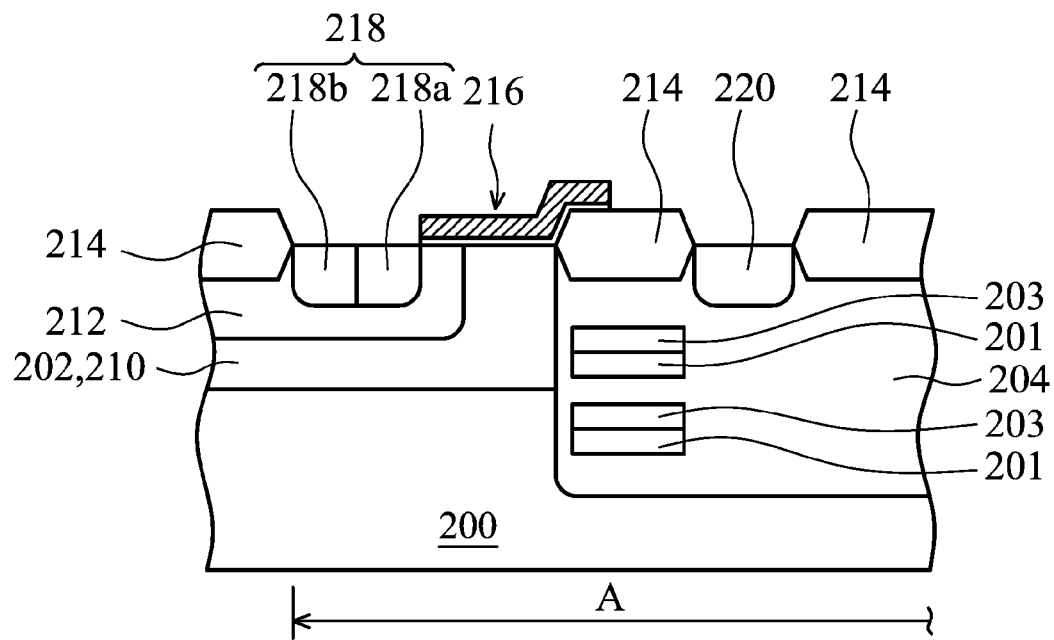
Figure 2D:
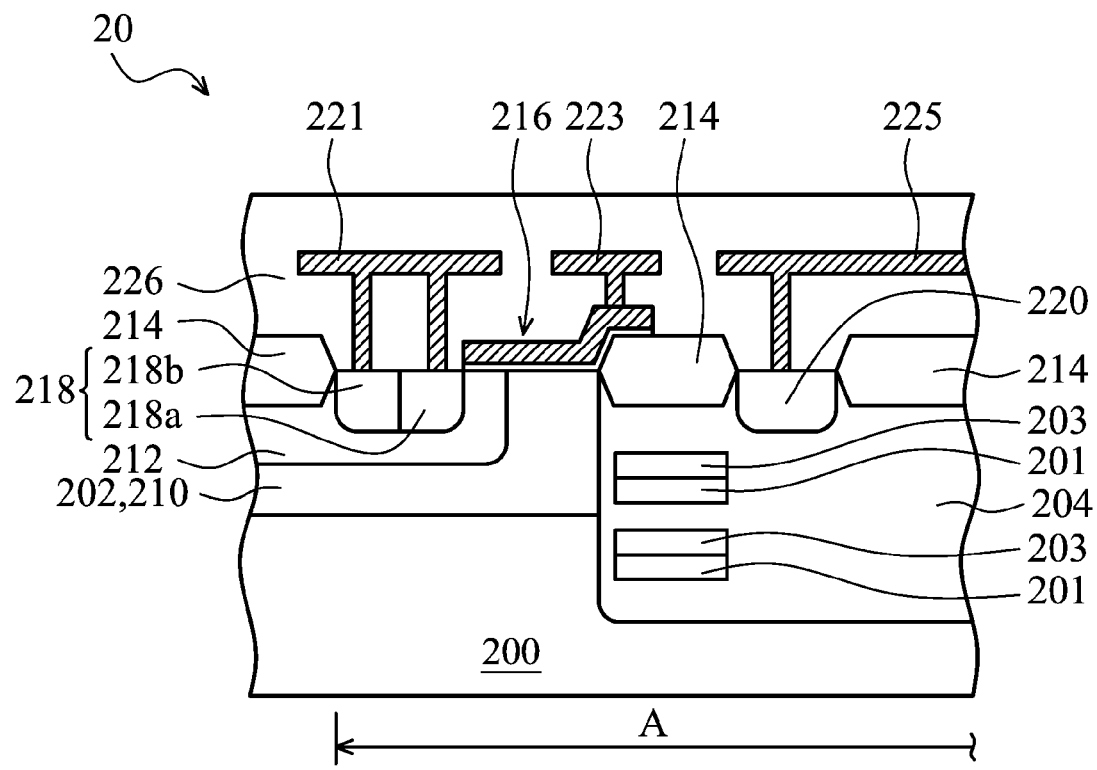

FIG. 2D illustrates a cross section of an exemplary embodiment of a semiconductor device 20 according to the invention. In the embodiment, the semiconductor device 20 may be a laterally diffused metal-oxide-semiconductor field effect transistor (LDMOSFET) having super junction structures. Moreover, the semiconductor device 20 comprises a semiconductor substrate 200, such as, a silicon substrate, silicon on insulator (SOI) substrate or other suitable semiconductor substrate, of a first conductivity type.

An epitaxial structure 210 of the first conductivity type is formed on the semiconductor substrate 200. In the embodiment, the epitaxial structure 210 is composed of a single epitaxial layer. A well region 204, a source region 218, a drain region 220 and a body region 212 are formed in the epitaxial structure 210. For example, the well region 204 of a second conductivity type opposite to the first conductivity type extends into the semiconductor substrate 200 from the epitaxial structure 210, such that the well region 204 is formed in the epitaxial structure 210 and the semiconductor substrate 200. Moreover, the well region 204 corresponds to an active region A (which is defined by a portion of the isolation structure, such as the field oxide layer 214) of the semiconductor substrate 200 to serve as a drift region of the LDMOSFET.

The source region 218 comprises a doped region 218a of the second conductivity type and a doped region 218b of the first conductivity type. The source region 218 is formed in the epitaxial structure 210 outside of the well region 204, such as an epitaxial layer 202, and corresponds to the active region A. Moreover, the body region 212 of the first conductivity type is formed in the epitaxial structure 210 outside of the well region 204, such that the source region 218 is in the body region 212. The drain region 220 is formed of the doped region of the second conductivity type only. The drain region 220 is formed in the well region 204 of the epitaxial structure 210 and corresponds to the active region A.

At least one set of the first heavily doped region 201 and second heavily doped region 203 is formed in the well region 204 between the drain region 220 and the source region 218, wherein the first heavily doped region 201 and the second heavily doped region 203 are stacked vertically from bottom to top and the first heavily doped region 201 is electrically floating. The first and second heavily doped regions 201 and 203 are respectively of the first and second conductivity types and have a doping concentration which is larger than that of the well region 204 to form a super junction structure in the well region 204 of the epitaxial structure 210. In the embodiment, the first conductivity type is p-type and the second conductivity type is n-type. Alternatively, the first conductivity type is n-type and the second conductivity type is p-type.

In the embodiment, at least one set of the first and second heavily doped regions 201 and 203 may be formed in the well region 204 of the epitaxial layer 202 (i.e., the epitaxial structure 210) and/or the semiconductor substrate 200. For example, the semiconductor device 20 may comprise two sets of first and second heavily doped regions 201 and 203 respectively formed in the well region 204 corresponding to the epitaxial layer 202 and corresponding to the semiconductor substrate 200. As shown in FIG. 2D, such two sets of first and second heavily doped regions 201 and 203 substantially align to each other vertically and two super junction structures are formed in the epitaxial layer 202 and the semiconductor substrate 200.

A gate structure 216 is disposed on the epitaxial structure 210 and between the source region 218 and the drain region 220. The gate structure 216 typically comprises a gate (e.g., a polysilicon gate), a gate dielectric layer underlying the gate and a field oxide layer 214 underlying the gate dielectric layer.

The semiconductor device 20 further comprises an interlayer dielectric (ILD) layer 226 and a plurality of interconnect structures 221, 223 and 225 therein. In the embodiment, the interconnect structure 221 is electrically connected to the source region 218 to serve as a source electrode, the interconnect structure 223 is electrically connected to the gate structure 216 to serve as a gate electrode and the interconnect structure 225 is electrically connected to the drain region 220 to serve as a drain electrode.

Figure 3A:
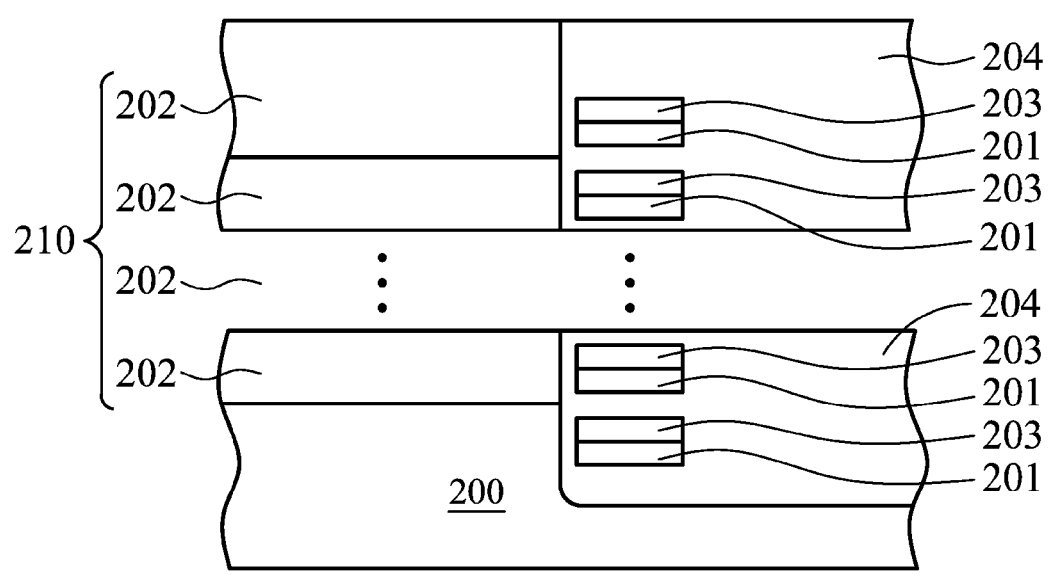
FIGS. 3A to 3B are cross sections of another exemplary embodiment of a method for fabricating a semiconductor device according to the invention.
Figure 3B:
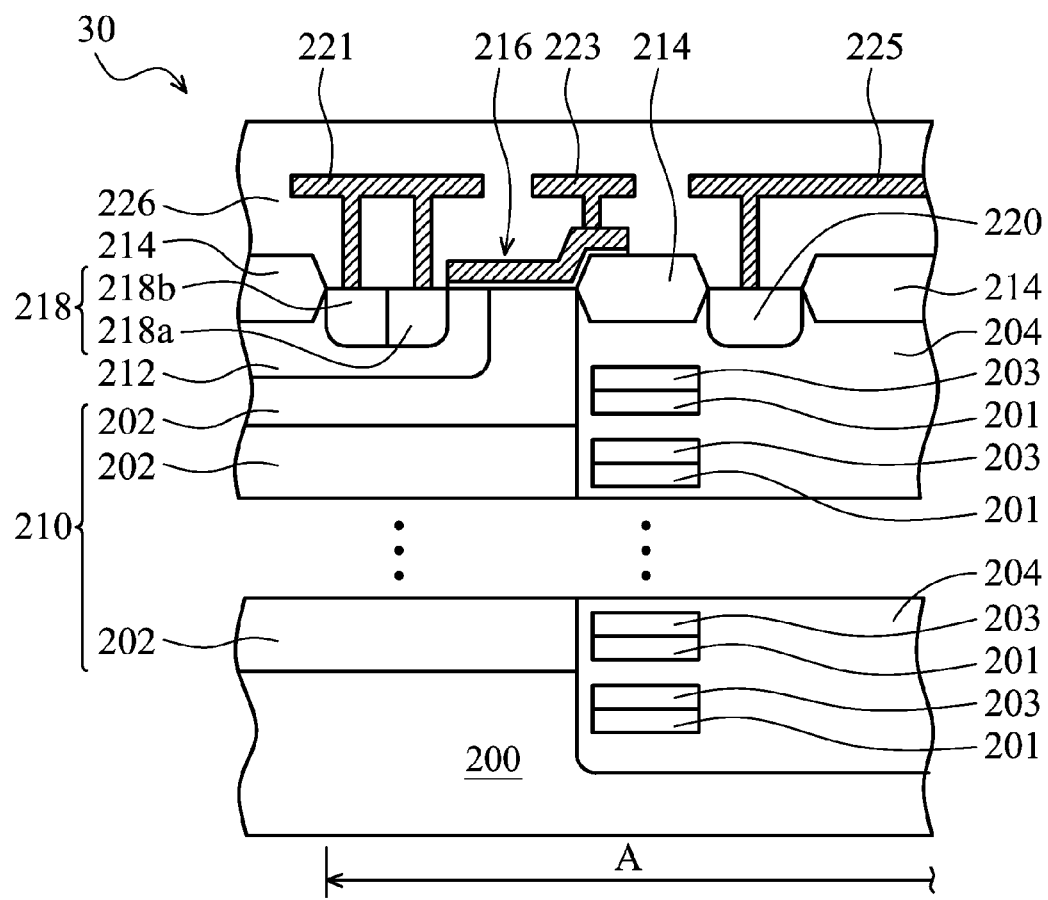

Referring to FIG. 3B, a cross section of another exemplary embodiment of a semiconductor device 30 according to the invention is shown. Elements in FIG. 3B that are the same as those in FIG. 2D are labeled with the same reference numbers as in FIG. 2D and are not described again for brevity. In the embodiment, the structure of the semiconductor device 30 is similar to that of the semiconductor device 20 (as shown in FIG. 2D). The difference is that the epitaxial structure 210 in the semiconductor device 30 comprises a plurality of vertically stacked epitaxial layers 202. It is realized that the number of epitaxial layers 202 used is determined by the design demands and is not limited to the embodiment in FIG. 3B (i.e., the epitaxial layers 202 may be more than three layers).

In the embodiment, the well region 204 extends into the underlying semiconductor substrate 200 from the epitaxial structure 210. Moreover, the source region 218, the drain region 220 and the body region 212 are formed in the uppermost epitaxial layer 202 of the epitaxial structure 210.

In one embodiment, the semiconductor device 30 comprises at least one set of the first and second heavily doped regions 201 and 203 formed in the well region 204 corresponding to the semiconductor substrate 200 or in the well region 204 corresponding to one of the epitaxial layers 202. In another embodiment, the semiconductor device 30 comprises a plurality of sets of first and second heavily doped regions 201 and 203 formed in the well region 204 corresponding to each epitaxial layer 202 and the semiconductor substrate 200. It is realized that the number of sets of first and second heavily doped regions 201 and 203 may be less than or equal to the number of epitaxial layers 202, such that none of the first and second heavily doped regions 201 and 203 is in the well region 204 corresponding to some of the epitaxial layers 202 and/or the semiconductor substrate 200. Compared with the embodiment in FIG. 2D, there may be more super junction structures in the embodiment in FIG. 3B.

In the foregoing embodiment, the heavily doped region of the first conductivity type and electrically floating in the super junction structure may help in the formation of a depletion region in the well region 204 (i.e., the drift region) thereby improving the withstand voltage of the LDMOSFET in the semiconductor device 20 or 30. Moreover, the heavily doped region of the second conductivity type in the super junction structure may provide an additional current path in the well region 204 (i.e., the drift region) to reduce the on-resistance between the source region and the drain region.

FIGS. 2A to 2D are cross sections of an exemplary embodiment of a method for fabricating a semiconductor device 20 according to the invention. Referring to FIG. 2A, a semiconductor substrate 200, such as a silicon substrate, a silicon on insulator (SOI) substrate or other suitable semiconductor substrates, of a first conductivity type is provided. Next, a well region 204 is formed in a predetermined region (i.e., an active region A) of the semiconductor substrate 200 sequentially by a doping process (e.g., ion implantation), and a thermal diffusion process.

Afterwards, an epitaxial structure 210 of the first conductivity type is formed on the semiconductor substrate 200. In the embodiment, the epitaxial structure 210 is composed of a single layer. For example, the epitaxial structure 210 is composed of an epitaxial layer 202. After forming the epitaxial layer 202 (i.e., the epitaxial structure 210) by an epitaxial growth process, the doping process (e.g., ion implantation), and the thermal diffusion process are sequentially performed in the epitaxial structure 210 corresponding to the active region A, such that the well region 204 in the semiconductor substrate 200 extends into the epitaxial structure 210, wherein the well region 204 of a second conductivity type different from the first conductivity type is configured to serve as a drift region of a subsequently formed LDMOSFET. In other embodiments, the well region 204 may be formed by other fabricating methods. For example, U.S. Pat. No. 7,682,955, disclosing a method for forming a deep well of a power device, is incorporated herein as reference.

In the embodiment, at least one set of the first and second heavily doped regions 201 and 203 is formed in the well region 204, wherein the first and second heavily doped regions 201 and 203 are stacked vertically from bottom to top. The first and second heavily doped regions 201 and 203 are respectively of the first and second conductivity types and have a doping concentration which is larger than that of the well region 204 to form a super junction structure in the well region 204 of the epitaxial structure 210. For example, after forming the well region 204 in the epitaxial structure 210 (i.e., the epitaxial layer 202), one set of the first and second heavily doped regions 201 and 203 is formed in the well region 204 of the epitaxial layer 202 by a doping process, such as ion implantation.

In another embodiment, one set of the first and second heavily doped regions 201 and 203 is formed in the well region 204 of the semiconductor substrate 200 before forming the epitaxial layer 202. In yet another embodiment, one set of the first and second heavily doped regions 201 and 203 is formed in the well region 204 of the semiconductor substrate 200 before forming the epitaxial layer 202. Next, another set of the first and second heavily doped regions 201 and 203 is formed in the well region 204 of the epitaxial layer 202 after forming the epitaxial layer 202 and a well region 204 therein, as shown in FIG. 2A. These two sets of first and second heavily doped regions 201 and 203 substantially and vertically align to each other to form two super junction structures in the epitaxial layer 202 and the semiconductor substrate 200.

In the foregoing embodiment, the first and second heavily doped regions 201 and 203 are between a drain region 220 and a source region 218 (as shown in FIG. 2C) that are subsequently formed, wherein the first heavily doped region 201 is electrically floating. In the embodiment, the first conductivity type is p-type and the second conductivity type is n-type. Alternatively, the first conductivity type is n-type and the second conductivity type is p-type.

Referring to FIGS. 2B and 2C, a plurality of isolation structures, such as a field oxide layer 214, may be formed on the epitaxial structure 210 by the conventional MOS process, wherein the active region A is defined by a portion of the field oxide layer 214 and a drain region D to be formed in the well region 204 is defined by the rest of the field oxide layer 214. Afterwards, a gate structure 216 is formed on the epitaxial structure 210 to define a source region S to be formed in the active region A outside of the well region 204, as shown in FIG. 2B.

Next, a body region 212 of the first conductivity type is optionally formed in the epitaxial structure 210 outside of the well region 204 sequentially by a doping process (e.g., ion implantation), and a thermal diffusion process, such that the subsequently formed source region 218 is in the body region 212. A doped region 218a of the second conductivity type is then formed in the source region S to be formed (as shown in FIG. 2B) and another doped region (i.e., the drain region 220) of the second conductivity type is formed in the drain region D to be formed (as shown in FIG. 2B) by a doping process (e.g., ion implantation). Afterwards, a doped region 218b of the first conductivity type is formed in the source region S to be formed (as shown in FIG. 2B) and adjacent to the doped region 218a, such that the doped region 218b and the doped region 218a form a source region 218, as shown in FIG. 2C.

In other embodiments, the doped region 218b may be formed before forming the doped region 218a and the drain region 220. In the embodiment, the doped region 218, the gate structure 216, the drain region 220 and the well region 204 having the super junction structures form an LDMOSFET.

Referring to FIG. 2D, an interlayer dielectric layer 226 and a plurality of interconnect structures 221, 223 and 225 therein are formed on an epitaxial layer 202 by the conventional metallization process. The interconnect structure 221 is electrically connected to the source region 218 to serve as a source electrode, the interconnect structure 223 is electrically connected to the gate structure 216 to serve as a gate electrode and the interconnect structure 225 is electrically connected to the drain region 220 to serve as a drain electrode. As a result, the fabrication of the semiconductor device 20 is completed.

FIGS. 3A to 3B are cross sections of another exemplary embodiment of a method for fabricating a semiconductor device 30 according to the invention. Elements in FIGS. 3A to 3B that are the same as those in FIGS. 2A to 2D are labeled with the same reference numbers as in FIGS. 2A to 2D and are not described again for brevity. Referring to FIG. 3A, a semiconductor substrate 200 is provided. Next, a well region 204 is formed in an active region A of the semiconductor substrate 200 sequentially by a doping process and a thermal diffusion process.

Afterwards, an epitaxial structure 210 of the first conductivity type is formed on the semiconductor substrate 200. In the embodiment, the epitaxial structure 210 comprises multiple layers. For example, the epitaxial structure 210 comprises a plurality of epitaxial layers 202 stacked vertically. The plurality of epitaxial layers 202 may be formed by an epitaxial growth process. It is noted that before forming the next epitaxial layer 202, a doping process and a thermal diffusion process are performed in the former epitaxial layer 202, such that the well region 204 in the semiconductor substrate 200 extends into the epitaxial structure 210 to serve as a drift region of the LDMOSFET subsequently formed.

In the embodiment, at least one set of the first and second heavily doped regions 201 and 203 is formed in the well region 204. For example, after forming the corresponding well region 204 in one of the epitaxial layers 202 of the epitaxial structure 210, one set of the first and second heavily doped regions 201 and 203 is formed in the well region 204 of the corresponding epitaxial layer 202.

In another embodiment, one set of the first and second heavily doped regions 201 and 203 may be formed in the well region 204 corresponding to the semiconductor substrate 200 before forming the epitaxial structure 210. In yet another embodiment, one set of the first and second heavily doped regions 201 and 203 may be formed in the well region 204 corresponding to the semiconductor substrate 200 before forming the epitaxial structure 210. Next, another set of the first and second heavily doped regions 201 and 203 may be formed in the corresponding well region 204 of each epitaxial layer 202, after forming each epitaxial layer 202 and the corresponding well region 204 therein, as shown in FIG. 3A. The plurality of sets of first and second heavily doped regions 201 and 203 substantially align to each other vertically and a plurality of super junction structures are formed in the epitaxial structure 210 and the semiconductor substrate 200.

Referring to FIG. 3B, a field oxide layer 214 and a gate structure 216 may be formed on the epitaxial structure 210 and a body region 212, a source region 218 and a drain region 220 may be formed on the uppermost epitaxial layer 202 by the conventional MOS process. Afterwards, an interlayer dielectric (ILD) layer 226 and a plurality of interconnect structures 221, 223 and 225 therein may be formed on the epitaxial structure 210 by the conventional metallization process. As a result, fabrication of the semiconductor device 30 is completed.

According to the foregoing embodiments, the heavily doped region of the first conductivity type and electrically floating in the super junction structure may form a depletion region in the drift region, so that the withstand voltage of the LDMOSFET in the semiconductor device is improved. Moreover, the heavily doped region of the second conductivity type in the super junction structure may provide an additional current path in the drift region, so that the on-resistance of the LDMOSFET is reduced. Additionally, according to the foregoing embodiments, the number of super junction structures stacked vertically in the drift region may be controlled to further improve the withstand voltage of the LDMOSFET while preventing the on-resistance of the LDMOSFET from increasing.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate of a first conductivity type;
   an epitaxial structure of the first conductivity type disposed on the semiconductor substrate;
   a well region of a second conductivity type formed in the epitaxial structure and the semiconductor substrate;
   a drain region and a source region respectively formed in the epitaxial structure inside and outside of the well region;
   at least one set of the first and second heavily doped regions formed in the well region between the drain region and the source region, wherein the first and second heavily doped regions of the first and second conductivity types, respectively, are stacked vertically from bottom to top and have a doping concentration which is larger than that of the well region; and
   a gate structure disposed on the epitaxial structure.

2. The semiconductor device of claim 1, wherein the first heavily doped region is electrically floating.

3. The semiconductor device of claim 1, wherein the epitaxial structure is composed of a single epitaxial layer and the set of first and second heavily doped regions is formed in the well region corresponding to the epitaxial layer or the semiconductor substrate.

4. The semiconductor device of claim 1, further comprising two sets of first and second heavily doped regions, wherein the epitaxial structure is composed of a single epitaxial layer and the two sets of first and second heavily doped regions are respectively formed in the well region corresponding to the epitaxial layer and the semiconductor substrate.

5. The semiconductor device of claim 1, wherein the epitaxial structure comprises a plurality of epitaxial layers stacked vertically and the set of first and second heavily doped regions is formed in the well region corresponding to the semiconductor substrate or one of the plurality of epitaxial layers.

6. The semiconductor device of claim 1, further comprising a plurality of sets of first and second heavily doped regions, wherein the epitaxial structure comprises a plurality of epitaxial layers stacked vertically and the plurality of sets of first and second heavily doped regions are correspondingly formed in the well region corresponding to the each epitaxial layer and the semiconductor substrate.

7. The semiconductor device of claim 1, wherein the first conductivity type is p-type and the second conductivity type is n-type.

8. The semiconductor device of claim 1, wherein the first conductivity type is n-type and the second conductivity type is p-type.

9. The semiconductor device of claim 1, further comprising a body region of the first conductivity type formed in the epitaxial structure outside of the well region, such that the source region is in the body region.

10. A method for fabricating a semiconductor device, comprising:
    providing a semiconductor substrate of a first conductivity type;
    forming an epitaxial structure of the first conductivity type on the semiconductor substrate;
    forming a well region of a second conductivity type in the epitaxial structure and the semiconductor substrate;
    forming at least one set of the first and second heavily doped regions in the well region, wherein the first and second heavily doped regions of the first and second conductivity types, respectively, are stacked vertically from bottom to top and have a doping concentration which is larger than that of the well region;
    forming a drain region and a source region respectively in the epitaxial structure inside and outside of the well region, such that the set of first and second heavily doped regions is in the well region between the drain region and the source region; and
    forming a gate structure on the epitaxial structure.

11. The method of claim 10, wherein the first heavily doped region is electrically floating.

12. The method of claim 10, wherein the epitaxial structure is composed of a single epitaxial layer and the set of first and second heavily doped regions is formed in the well region corresponding to the epitaxial layer or the semiconductor substrate.

13. The method of claim 10, further comprising forming two sets of first and second heavily doped regions in the well region, wherein the epitaxial structure is composed of a single epitaxial layer and the two sets of first and second heavily doped regions are respectively formed in the well region corresponding to the epitaxial layer and the semiconductor substrate.

14. The method of claim 10, wherein the epitaxial structure comprises a plurality of epitaxial layers stacked vertically and the set of first and second heavily doped regions is formed in the well region corresponding to the semiconductor substrate or one of the plurality of epitaxial layers.

15. The method of claim 10, further comprising forming a plurality of sets of first and second heavily doped regions in the well region, wherein the epitaxial structure comprises a plurality of epitaxial layers stacked vertically and the plurality of sets of first and second heavily doped regions are correspondingly formed in the well region corresponding to the each epitaxial layer and the semiconductor substrate.

16. The method of claim 10, wherein the first conductivity type is p-type and the second conductivity type is n-type.

17. The method of claim 10, wherein the first conductivity type is n-type and the second conductivity type is p-type.

18. The method of claim 10, further comprising forming a body region of the first conductivity type in the epitaxial structure outside of the well region, such that the source region is in the body region.

* * * * *